United States Patent
Sin et al.

(10) Patent No.: US 7,289,303 B1
(45) Date of Patent: Oct. 30, 2007

(54) SPIN VALVE SENSORS HAVING SYNTHETIC ANTIFERROMAGNET FOR LONGITUDINAL BIAS

(75) Inventors: Kyusik Sin, Pleasanton, CA (US); Ningjia Zhu, Fremont, CA (US); Yingjian Chen, Fremont, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 1226 days.

(21) Appl. No.: 09/828,635

(22) Filed: Apr. 5, 2001

(51) Int. Cl.
*G11B 5/39* (2006.01)

(52) U.S. Cl. .............. 360/324.1; 360/324.11; 360/324.12; 428/811; 428/811.2; 428/811.5

(58) Field of Classification Search .......... 428/611, 428/655, 668, 692; 360/313, 324.1, 325
See application file for complete search history.

(56) References Cited

U.S. PATENT DOCUMENTS

| | | | |
|---|---|---|---|
| 5,287,238 A * | 2/1994 | Baumgart et al. ........ 360/314 |
| 5,408,377 A | 4/1995 | Gurney et al. ............. 360/113 |
| 5,436,778 A | 7/1995 | Lin et al. ................ 360/327.32 |
| 5,666,247 A | 9/1997 | Schultz ................... 360/327.32 |
| 5,725,963 A | 3/1998 | Iwasaki et al. ............ 428/611 |
| 5,742,459 A | 4/1998 | Shen et al. ............. 360/327.32 |
| 5,756,191 A | 5/1998 | Hashimoto et al. ........ 428/209 |
| 5,768,066 A | 6/1998 | Akiyama et al. .......... 360/314 |
| 5,768,067 A | 6/1998 | Saito et al. ............ 360/327.32 |
| 5,896,252 A | 4/1999 | Kanai ..................... 360/113 |
| 5,910,868 A | 6/1999 | Kurosawa et al. ...... 360/327.32 |
| 5,914,839 A | 6/1999 | Matsuzono et al. ........ 360/315 |
| 5,949,622 A | 9/1999 | Kamiguchi et al. .... 360/324.12 |
| 5,958,576 A | 9/1999 | Takiguchi ................ 428/332 |
| 5,976,713 A | 11/1999 | Fuke et al. ............... 428/692 |
| 5,989,690 A | 11/1999 | Fujikata et al. ........... 428/212 |
| 5,991,125 A * | 11/1999 | Iwasaki et al. ........ 360/324.12 |
| 5,995,338 A * | 11/1999 | Watanabe et al. ..... 360/324.12 |
| 6,031,692 A | 2/2000 | Kawawake et al. .... 360/324.12 |
| 6,055,135 A | 4/2000 | Fukamichi et al. .... 360/324.12 |
| 6,061,210 A | 5/2000 | Gill ..................... 360/324.12 |
| 6,122,151 A * | 9/2000 | Saito et al. ........... 360/324.12 |
| 6,201,673 B1 | 3/2001 | Rottmayer et al. |
| 6,381,105 B1 * | 4/2002 | Huai et al. ................. 360/314 |

(Continued)

OTHER PUBLICATIONS

Merriam-Webster's Collegiate Dictionary, 10th Ed., p. 14.*

(Continued)

*Primary Examiner*—Kevin M. Bernatz
(74) *Attorney, Agent, or Firm*—Strategic Patent Group

(57) ABSTRACT

Magnetoresistive (MR) sensors are disclosed having mechanisms for reducing edge effects such as Barkhausen noise. The sensors include a pinned layer and a free layer with an exchange coupling layer adjoining the free layer, and a ferromagnetic layer having a fixed magnetic moment adjoining the exchange coupling layer. The exchange coupling layer and ferromagnetic layer form a synthetic antiferromagnetic structure with part of the free layer, providing bias that reduces magnetic instabilities at edges of the free layer. Such synthetic antiferromagnetic structures can provide a stronger bias than conventional antiferromagnetic layers, as well as a more exactly defined track width than conventional hard magnetic bias layers. The synthetic antiferromagnetic structures can also provide protection for the free layer during processing, in contrast with the trimming of conventional antiferromagnetic layers that exposes if not removes part of the free layer.

13 Claims, 3 Drawing Sheets

U.S. PATENT DOCUMENTS

| | | | |
|---|---|---|---|
| 6,396,734 B2 * | 5/2002 | Ishikawa et al. | 365/158 |
| 6,462,919 B1 * | 10/2002 | Mack et al. | 360/327.3 |
| 6,496,338 B2 * | 12/2002 | Hasegawa et al. | 360/324.12 |
| 6,501,627 B2 * | 12/2002 | Noma et al. | 360/324.12 |
| 2001/0033466 A1 * | 10/2001 | Ooshima et al. | 360/324.12 |
| 2001/0050859 A1 * | 12/2001 | Schwarzl | 365/158 |
| 2004/0136122 A1 * | 7/2004 | Beach | 360/324.12 |

OTHER PUBLICATIONS

Derwemt Abstract of WO 2001-03130 A1 (Derwent Acc. No.: 2001-535833).*

Derwent Abstract Translation of US 2001/0050859 A1 and DE 19836567 A1 (Derwent Acc-No. 2000-183992).*

* cited by examiner

SPIN VALVE SENSORS HAVING SYNTHETIC ANTIFERROMAGNET FOR LONGITUDINAL BIAS

BACKGROUND

The present invention relates to magnetoresistive (MR) sensing mechanisms, which may for example be employed in information storage systems or measurement and testing systems.

FIG. 1 shows a prior art spin valve (SV) sensor 20 that may be used in a head of a disk drive. The sensor 20 has a magnetic pinning structure 22 that may be a permanent magnet, an antiferromagnetic material, or a synthetic antiferromagnetic structure. Pinning structure 22 may include plural layers, as is well known. For example, a synthetic antiferromagnetic structure includes a pair of ferromagnetic layers sandwiched about a very thin exchange coupling layer of ruthenium (Ru), iridium (Ir) or rhodium (Rh). The pinning structure 22 functions to pin or set the magnetization of an adjoining first ferromagnetic layer 25, which may be termed the pinned layer. Adjoining the pinned layer 25 is an electrically conductive spacer layer 27, which is adjoined by a second ferromagnetic layer 29 that may be termed the free layer.

The sensor 20 may be formed on a wafer substrate with thousands of other sensors. For the situation in which sensor 20 has the pinned layer 22 formed prior to the free layer 29, sensor 20 may be termed a bottom SV sensor. A SV sensor in which the order is reversed, with a free layer formed prior to the pinned layer, may be termed a top SV sensor.

After formation of the pinned and free layers as described above, the sensor 20 is separated from other sensors on the wafer by ion beam etching (IBE) or similar removal techniques, and chromium (CR) layers 30 are formed, followed by cobalt-chrome-platinum (CoCrPt) bias layers 33 and lead layer 35. The Cr layers provide a surface that encourages growth of bias layers 33 as a permanent or "hard" magnet. The bias layers 33 provide a magnetic field to the adjacent edges of the free layer, to reduce magnetic instability in those edges that could otherwise result in noise.

In operation, the leads 35 provide a sense current that flows along the conductive layer 27, with the resistance to that flow dependent upon the relative magnetization directions of the free 29 and pinned 27 layers. The magnetization direction of the free layer 29 is designed to change due to magnetic fields from a storage medium such as a disk, while the magnetization direction of the pinned layer 29 remains constant, so that the change in current or voltage of the leads 35 indicates the magnetic field direction of the medium.

FIG. 2 shows another type of bottom SV sensor 50, for which the pinning structure 22, pinned layer 25, conductive layer 27 and free layer 29 are essentially the same as described previously. Sensor 50 has a pair of antiferromagnetic layers 52, however, overlapping free layer 29 in order to pin edges of the free layer to reduce magnetic instability in those edges that could otherwise result in noise. Leads 55 cause current to flow through conductive layer 27, with the resistance to that current indicating the magnetic fields felt by the sensor.

The antiferromagnetic layers 52 are formed by IBE or similar trimming that may remove a small amount of the free layer 29, which can create additional edge effects in the free layer at the edge of the antiferromagnetic layers 52. It is also possible to have a hard bias layer overlapping the free layer, however, in this case a seed layer of Cr that is formed to encourage appropriate growth of the hard bias layer interferes with the coupling between the hard bias layer and the free layer.

SUMMARY

Magnetoresistive (MR) sensors are disclosed that offer improved mechanisms for reducing edge effects such as Barkhausen noise in a sensing layer. Such sensors include a pinned layer and a free layer with an exchange coupling layer adjoining the free layer, and a ferromagnetic layer having a fixed magnetic moment adjoining the exchange coupling layer. The exchange coupling layer and ferromagnetic layer form a synthetic antiferromagnetic structure with part of the free layer, providing bias that reduces magnetic instabilities at edges of the free layer.

Such synthetic antiferromagnetic structures can provide a stronger bias than conventional antiferromagnetic layers, as well as a more exactly defined track width than conventional hard magnetic bias layers. The synthetic antiferromagnetic structures can also provide protection for the free layer during processing, in contrast with the trimming of conventional antiferromagnetic layers that exposes if not removes part of the free layer.

DETAILED DESCRIPTION OF THE PREFERRED EMBODIMENTS

Figure 1:
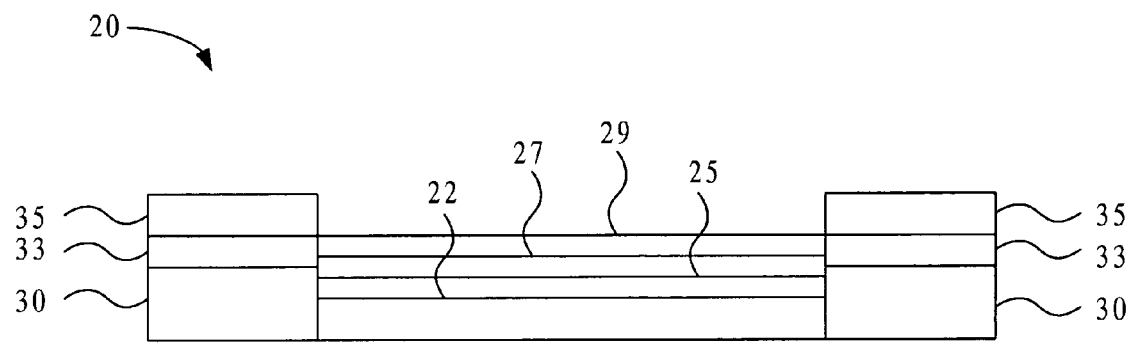
FIG. 1 shows a prior art bottom spin valve (SV) sensor having hard magnetic layers that bias a free layer.
Figure 2:
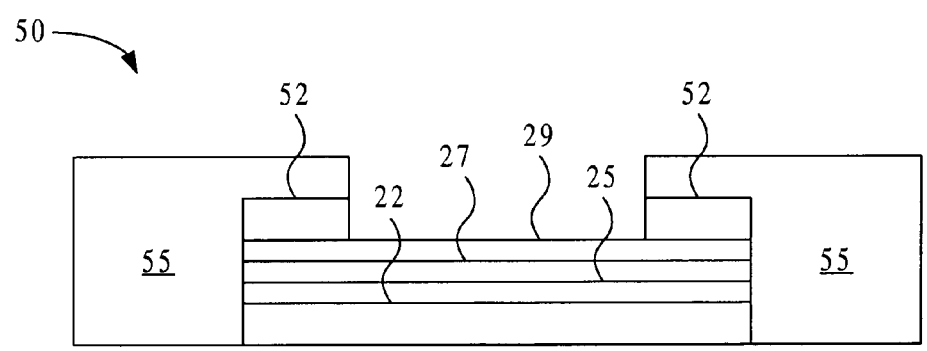
FIG. 2 shows a prior art bottom SV sensor having antiferromagnetic layers that bias a free layer.
Figure 3:
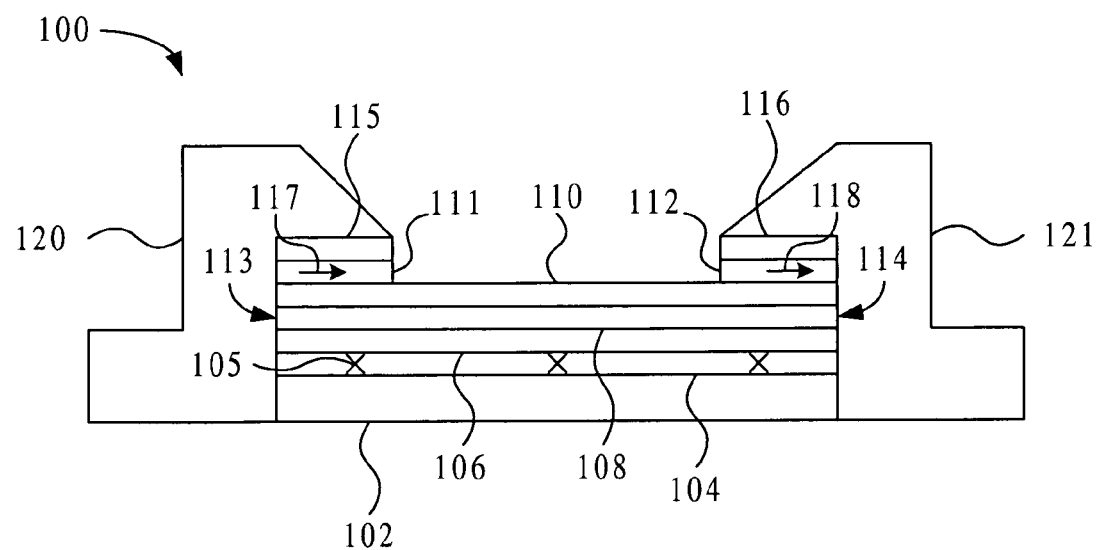
FIG. 3 shows a bottom spin valve (SV) sensor having synthetic antiferromagnetic layers that bias a free layer.

FIG. 3 depicts a bottom SV or giant magnetoresistive (GMR) sensor 100 in accordance with the present invention. A pinning structure 102 functions to pin or set a magnetic moment of an adjoining first ferromagnetic layer 104, which may be termed the pinned layer. The pinned layer 104 in this figure has a magnetic moment directed away from the viewer, as shown by X marks 105. The pinning structure 102 may include a permanent or hard magnetic layer, an antiferromagnetic layer, or a synthetic antiferromagnetic structure that adjoins a hard magnetic layer or antiferromagnetic layer.

Such a synthetic antiferromagnetic structure may include a pair of ferromagnetic layers sandwiched about a nonferromagnetic layer, such as a very thin exchange coupling layer of ruthenium (Ru), iridium (Ir) or rhodium (Rh). The ferromagnetic layers may be made of nickel-iron (NiFe) and a seed layer of nickel-iron-chromium (NiFeCr) may be formed prior to forming the synthetic antiferromagnetic structure.

Adjoining the pinned layer 104 is an electrically conductive spacer layer 106, which is adjoined by a second ferromagnetic layer 108 that may be termed the free layer. The pinned layer 104 and the free layer 108 may each be formed of NiFe or other materials known in the art of MR sensors, and may each have a thickness in a range between less than 5 angstroms (Å) and greater than 30 Å. The spacer layer 106 may be formed of copper (Cu), gold (Au) or silver (Ag) or other materials known in the art, and may have a thickness in a range between less than 15 Å and greater than 30 Å.

Adjoining the free layer 108 is a coupling layer 110 made of a nonferromagnetic, electrically conductive material. In one embodiment, the coupling layer 110 is made of material such as ruthenium (Ru), iridium (Ir) or rhodium (RH), and has a thickness that may be in a range between about 5 Å and about 10 Å. Bias layers 111 and 112, which may be formed of ferromagnetic material to a thickness between about 5 Å and about 30 Å, adjoin the coupling layer 110 adjacent to edges 113 and 114 of the free layer 108, the bias layers having a magnetic moment fixed in a direction substantially perpendicular to that of the pinned layer 104. Antiferromagnetic layers 115 and 116 or other pinning structures adjoin the bias layers 111 and 112, pinning the magnetic moments of the bias layers 111 and 112 in a direction shown by arrows 117 and 118. Coupling layer 110, bias layers 111 and 112, and antiferromagnetic layers 115 and 116 together form bias structures for edge portions of the free layer 108.

Electrically conductive leads 120 and 121 abut edges 113 and 114, contacting the pinned layer 104, spacer layer 106 and free layer 108. Leads 120 and 121 may be formed of a layer of gold (Au) sandwiched by a pair of tantalum (Ta) layers. In operation, the leads 120 and 121 provide a sense current that flows at least along the spacer layer 106, with the resistance to that flow dependent upon the relative directions of the magnetic moments of the free 108 and pinned 104 layers. The magnetization direction of the free layer 108 is designed to change in response to magnetic fields from a storage medium such as a disk, while the magnetization direction of the pinned layer 104 remains constant, so that a change in sense current or voltage between the leads indicates a change in the magnetic field of the medium.

Portions of the free layer 108 located near edges 113 and 114 and overlapped by the bias layers 111 and 112 are coupled to the bias layers, with magnetic moments directed substantially opposite to those of the bias layers. Magnetic domains of those edge portions of the free layer 108 are thus stabilized by coupling to bias layers 111 and 112, reducing Barkhausen noise in the sensor 100. The magnetic stabilization provided to edge portions of free layer 108 by bias structures can be stronger than that provided by prior art antiferromagnetic or hard magnetic bias mechanisms. Moreover, the portion of the free layer that is not overlapped by the bias layers 111 and 112 may define a sensing width (sometimes called a trackwidth) of sensor 100 more exactly than in prior art sensors.

Figure 4:
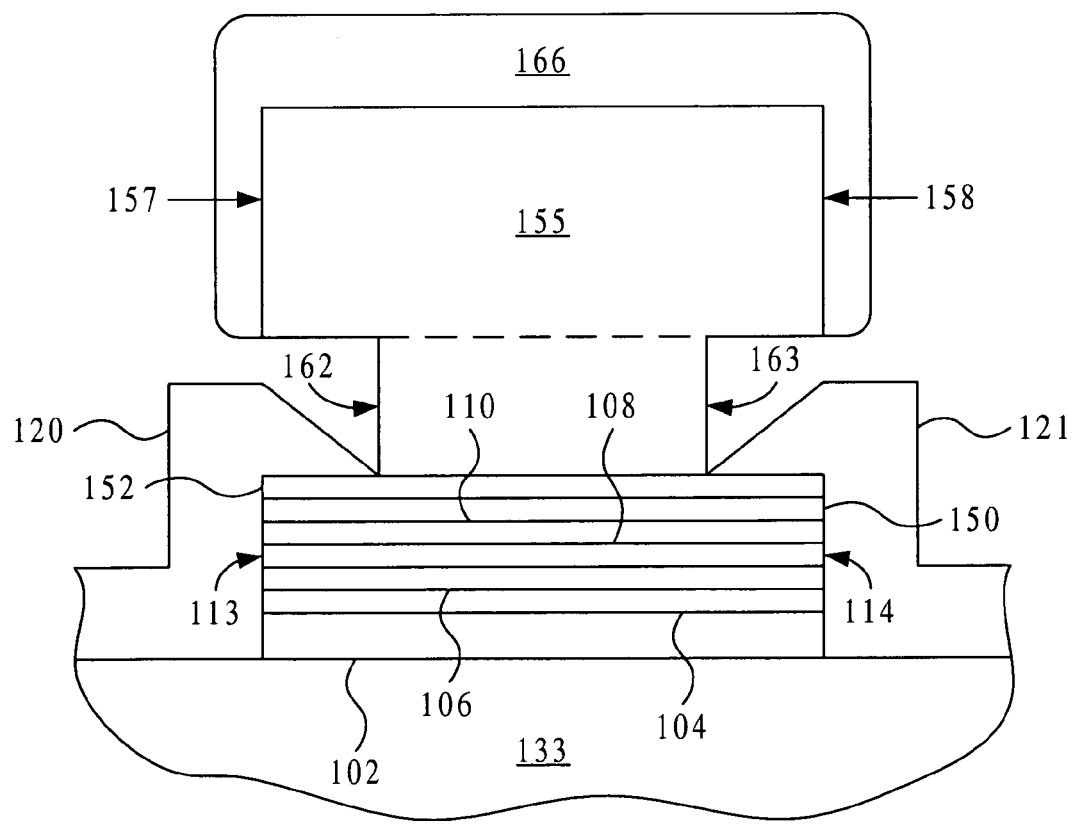
FIG. 4 shows some initial steps in the formation of the sensor of FIG. 3.

FIG. 4 shows some initial steps in forming the sensor 100 of FIG. 3. On a wafer substrate 133 that may be made of alumina-titanium-carbide ($Al_2O_3$TiC) or silicon carbide (SiC), for example, first pinning structure 102 has been formed by sputtering or other vacuum deposition techniques. Pinning structure 102 may include a first antiferromagnetic layer made of material such as PtMn, PtPdMn, IrMn, FrMnRh, FeMn or other materials that have antiferromagnetic properties. Pinning structure 102 may also a include synthetic antiferromagnetic structure formed of a pair of ferromagnetic layers separated by an exchange coupling layer, such as a less than 10 Å thick layer of Ru or Rh. A seed layer of NiFeCr or other materials may be formed prior to forming pinning structure 102. Atop pinning structure 102, first (pinned) ferromagnetic layer 104, electrically conductive (spacer) layer 106, and second (free) ferromagnetic layer 108 have been formed by similar techniques.

Exchange coupling layer 110 is then formed atop free layer 108, followed by formation of a third ferromagnetic layer 150, and formation of a second antiferromagnetic layer 152 made of material such as PtMn, PtPdMn, IrMn, FrMnRh, FeMn, NiO or other materials that have antiferromagnetic properties, all of which may be formed by sputtering or other vacuum deposition techniques. In order to create individual sensors from the above-described layers that coat the wafer 133, masks such as conventional bi-layer mask 155 are defined by photolithography. Mask 155 has outer edges 157 and 158 and inner edges 162 and 163, that are used to define outer edges and trackwidth of the sensor, respectively. Outer edges of the sensor, including edges 113 and 114 of the free layer 108, are defined by IBE or similar directional etching that removes uncovered sensor layers. Leads 120 and 121 are then created by sputtering or other vacuum deposition techniques, with a portion of leads 120 and 121 extending to meet inner edges 162 and 163, respectively. Mask 155 may be coated with a layer of the material 166 used to form the leads, but overhangs of the bi-layer mask 155 allow access by a solvent, dissolving mask 155 and lifting off material 166 as well.

Figure 5:
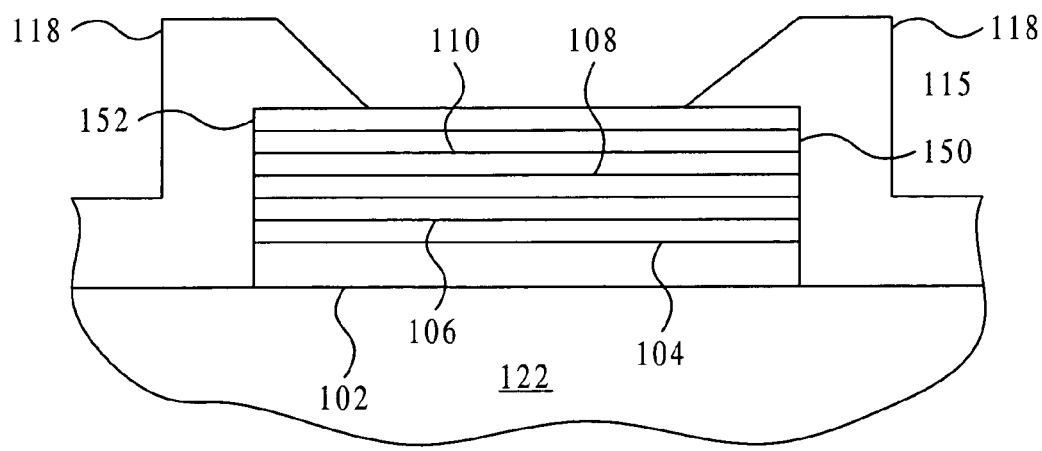
FIG. 5 shows some steps in the formation of the sensor of FIG. 3 subsequent to those shown in FIG. 4.

In FIG. 5, the mask has been removed, exposing an inner portion of layer 152. Inner portion of layers 150 and 152 are then removed by IBE or similar directional etching, leaving coupling layer 110 protecting free layer 108, as shown in FIG. 3.

Different magnetic directions of the pinned layer 105 and the bias layers 113 and 114 may be set by using antiferromagnetic pinning materials having different blocking temperatures for the pinned and bias layers, and changing the magnetic field direction while annealing at the different blocking temperatures. That is, a magnetic field is applied in a first direction as the temperature is reduced from above the blocking temperature of the higher blocking temperature materials, and then a magnetic field is applied in a second direction as the temperature is reduced from above the blocking temperature of the lower blocking temperature materials.

For the case in which pinning structure 102 includes an antiferromagnetic layer with a relatively low blocking temperature (e.g., IrMn, FrMnRh or FeMn) and antiferromagnetic layers 115 and 116 include an antiferromagnetic material with a relatively high blocking temperature (e.g., PtMn or PtPdMn), the applied magnetic field is oriented along the direction desired for bias layers 111 and 112 as the temperature is reduced from above the high blocking temperature, and then the applied magnetic field is oriented along the direction desired for pinned layer 104 as the temperature is reduced from above the low blocking temperature.

For the case in which pinning structure 102 includes an antiferromagnetic layer with a relatively high blocking temperature (e.g., PtMn or PtPdMn) and antiferromagnetic layers 115 and 116 include an antiferromagnetic material with a relatively low blocking temperature (e.g., IrMn, FrMnRh or FeMn), the applied magnetic field is oriented along the direction desired for pinned layer 104 as the temperature is reduced from above the high blocking temperature, and then the applied magnetic field is oriented along the direction desired for bias layers 111 and 112 as the temperature is reduced from above the low blocking temperature.

For some sensors it may be desirable to employ a material with a high blocking temperature in a layer formed prior to forming the free and pinned layers, to avoid damage to the free and pinned layers by fixing the magnetization with high temperature annealing prior to forming the free and pinned layers. The sensor 100 may be part of a magnetic head that includes a write element that may be previously or subsequently formed. Alternatively, the sensor may be used for measuring or testing magnetic fields.

Figure 6:
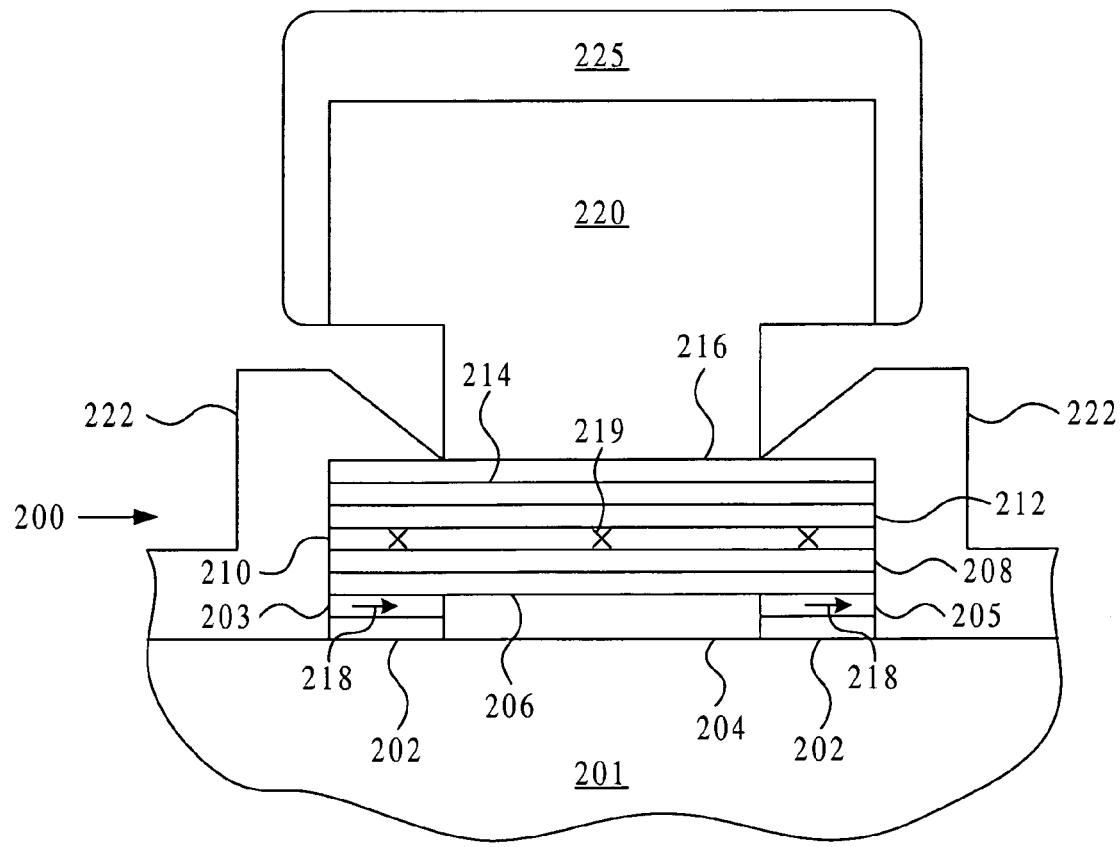
FIG. 6 shows some steps in the formation of a top spin valve (SV) sensor that may have synthetic antiferromagnetic layers that bias a free layer.

FIG. 6 shows some initial steps in forming another sensor 200 in accordance with the present invention. In this embodiment, a Cr seed layer 202 is formed over a wafer substrate 201, the Cr layer 202 encouraging favorable crystallographic formation of CoCrPt hard magnetic layers 203 and 205 having a magnetic moment in a longitudinal direction shown by arrows 218. The Cr layer 202 may be formed to a thickness of between 50 Å and 300 Å, for example, and hard magnetic layers 203 and 205 may be formed to a thickness of between 5 Å and 200 Å, for example. The Cr layer 202 and hard magnetic layer 203 are then trimmed, for example by IBE, and a nonferromagnetic, electrically insulating or highly resistive spacer layer 204 is formed between the hard magnetic layers 203 and 205. A first soft or free ferromagnetic layer 206 is then formed adjoining the hard magnetic layers 203 and 205. Alternatively, instead of employing a hard magnet for biasing, layers 202 may be antiferromagnetic and layers 203 may be formed of a ferromagnetic bias layer and an electrically conductive, nonferromagnetic exchange coupling layer, on which the free layer may be formed and coupled to the bias layer.

An electrically conductive spacer layer 208 is then formed on the free layer 206, followed by a second soft or pinned ferromagnetic layer 210. An electrically conductive, nonferromagnetic exchange coupling layer 212 is then formed, followed by another ferromagnetic layer 214. An antiferromagnetic layer 216 is then formed which is used to fix the magnetic moment of the ferromagnetic layer 214 in a lateral direction, with the pinned layer 210 having a magnetic moment in an opposite direction, as shown by X-marks 219. A bi-layer mask 220 and then leads 222 are formed, with excess lead material 225 removed by dissolving the mask 220. The resulting bottom SV sensor has improved biasing of the free layer for reduced Barkhausen noise, as well as an accurately defined trackwidth.

Although we have focused on teaching the preferred embodiments of an improved magnetoresistive sensor, other embodiments and modifications of this invention will be apparent to persons of ordinary skill in the art in view of these teachings. Therefore, this invention is limited only by the following claims, which include all such embodiments and modifications when viewed in conjunction with the above specification and accompanying drawings.

The invention claimed is:

1. A sensor comprising:
    first, second and third ferromagnetic layers that are interleaved with first and second nonferromagnetic layers, said first nonferromagnetic layer residing between said first and second ferromagnetic layers, said second nonferromagnetic layer residing between said second and third ferromagnetic layers, said first and third ferromagnetic layers having magnetic moments with directions that are fixed in response to an applied magnetic field, said second ferromagnetic layer having a free portion and a fixed portion, said free portion having a magnetic moment with a direction that rotates in response to said applied magnetic field and said fixed portion having a magnetic moment with a direction that does not rotate in response to said applied magnetic field; and
    first and second antiferromagnetic layers having different blocking temperatures, said first antiferromagnetic layer adjoining said first ferromagnetic layer and said second antiferromagnetic layer adjoining said third ferromagnetic layer, said second antiferromagnetic layer having a low blocking temperature and said first antiferromagnetic layer having a high blocking temperature;
    wherein said third ferromagnetic layer overlaps said fixed portion and does not overlap said free portion.

2. The sensor of claim 1, wherein at least one of said first and second nonferromagnetic layers is electrically conductive.

3. The sensor of claim 1, further comprising a fourth ferromagnetic layer and a third nonferromagnetic layer, wherein said third nonferromagnetic layer adjoins said first and fourth ferromagnetic layers.

4. The sensor of claim 1, wherein at least one of said first and second nonferromagnetic layers includes ruthenium, iridium or rhodium.

5. The sensor of claim 1, further comprising a fourth ferromagnetic layer adjoining said second nonferromagnetic layer and separated from said third ferromagnetic layer.

6. The sensor of claim 1, wherein said direction of said magnetic moments of said first and third ferromagnetic layers are substantially perpendicular.

7. A sensor comprising:
    a ferromagnetic pinned layer and a ferromagnetic free layer that are separated by an electrically conductive spacer layer,
    a pinning structure adjoining said pinned layer and adapted to fix a magnetic moment of said pinned layer in a first direction,
    a bias structure adjoining said free layer and adapted to stabilize magnetic domains of said free layer in a second direction, said bias structure including a ferromagnetic bias layer exchange coupled to a portion of said free layer by a nonferromagnetic layer; and
    wherein said pinning structure includes a first antiferromagnetic layer and said bias structure includes a second antiferromagnetic layer, said first antiferromagnetic layer having a different blocking temperature than said second antiferromagnetic layer, said second antiferromagnetic layer having a low blocking temperature and said first antiferromagnetic layer having a high blocking temperature.

8. The sensor of claim 7, wherein said free layer has a magnetically stabilized portion adjacent to said bias layer.

9. The sensor of claim 7 wherein said nonferromagnetic layer includes ruthenium, iridium or rhodium.

10. The sensor of claim 7, wherein said directions of said magnetic moments of said first and third ferromagnetic layers are substantially perpendicular.

11. A sensor comprising:
    first and second ferromagnetic layers that are disposed substantially in a plane,
    a third ferromagnetic layer that is not disposed in said plane, said third ferromagnetic layer having a first portion disposed proximate to said first ferromagnetic layer, a second portion disposed proximate to said second ferromagnetic layer and a third portion disposed between said first and second portions and distal to said first and second ferromagnetic layers,
    a nonferromagnetic, electrically conductive layer adjoining said third ferromagnetic layer distal to said first and second ferromagnetic layers, and a fourth ferromagnetic layer adjoining said conductive layer, at least a first antiferromagnetic layer adjoining said first and second ferromagnetic layers; and a second antiferromagnetic layer adjoining said fourth ferromagnetic layer, said first antiferromagnetic layer having a different blocking temperature than said second antiferromagnetic layer, said first antiferromagnetic layer having a low blocking temperature and said second antiferromagnetic layer having a high blocking temperature;

wherein said fourth ferromagnetic layer has a magnetic moment that is fixed in the presence of an applied magnetic field, said first and second portions of said third ferromagnetic layer have magnetic moments that are fixed in the presence of said applied magnetic field and said third portion of said third ferromagnetic layer has a magnetic moment that varies in response to said applied magnetic field.

12. The sensor of claim 11, further comprising first and second nonferromagnetic, electrically conductive exchange coupling layers adjoining said first and second ferromagnetic layers and said third ferromagnetic layer.

13. The sensor of claim 12, wherein said exchange coupling layers include ruthenium, iridium or rhodium.

* * * * *